(12) United States Patent
Cho

(10) Patent No.: US 8,310,612 B2
(45) Date of Patent: Nov. 13, 2012

(54) THIN FILM TRANSISTOR LIQUID CRYSTAL DISPLAY PANEL HAVING GATE LINE AND DATA LINE FORMED ON SAME LAYER AND METHOD OF FABRICATING THE SAME

(75) Inventor: Bong Rae Cho, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 337 days.

(21) Appl. No.: 11/304,210

(22) Filed: Dec. 14, 2005

(65) Prior Publication Data

US 2007/0002195 A1  Jan. 4, 2007

(30) Foreign Application Priority Data

Jun. 30, 2005  (KR) .................. 10-2005-0058635

(51) Int. Cl.
  *G02F 1/136* (2006.01)
  *G02F 1/1333* (2006.01)
(52) U.S. Cl. ............... 349/47; 349/42; 349/43; 349/52; 349/138
(58) Field of Classification Search ............ 349/42–43, 349/138, 47, 52
  See application file for complete search history.

(56) References Cited

U.S. PATENT DOCUMENTS

| | | | | |
|---|---|---|---|---|
| 4,984,033 A | * | 1/1991 | Ishizu et al. | 257/98 |
| 5,771,083 A | * | 6/1998 | Fujihara et al. | 349/147 |
| 5,790,222 A | * | 8/1998 | Kim | 349/139 |
| 5,815,223 A | * | 9/1998 | Watanabe et al. | 349/42 |
| 6,115,094 A | * | 9/2000 | Fukunaga | 349/138 |
| 6,633,359 B1 | * | 10/2003 | Zhang et al. | 349/141 |
| 2004/0036816 A1 | * | 2/2004 | Yun | 349/43 |
| 2004/0263704 A1 | * | 12/2004 | Oh et al. | 349/43 |
| 2005/0134756 A1 | | 6/2005 | Yang et al. | |

FOREIGN PATENT DOCUMENTS

| | | |
|---|---|---|
| JP | 06-163891 | 6/1994 |
| JP | 09-160509 | 6/1997 |
| JP | 09-292626 | 11/1997 |

(Continued)

OTHER PUBLICATIONS

Notification of First Office Action for corresponding Chinese Patent Application Serial No. 200510116780.7, dated Nov. 9, 2007.

(Continued)

*Primary Examiner* — Lauren Nguyen
(74) *Attorney, Agent, or Firm* — Brinks Hofer Gilson & Lione

(57) ABSTRACT

A thin film transistor (TFT) liquid crystal display panel and fabrication method are described. The panel has a data line and a gate line connected with a TFT and formed on the same layer. One of data or gate lines is discontinuous and the other is continuous in a pixel region such that the continuous line bisects the discontinuous line. A passivation film protects the TFT. Contact holes penetrate the passivation film and expose segments of the discontinuous line. A contact electrode connects the segments through the contact holes.

12 Claims, 11 Drawing Sheets

FOREIGN PATENT DOCUMENTS

| | | | |
|---|---|---|---|
| JP | 10-041519 | | 2/1998 |
| JP | 2001-177097 | | 6/2001 |
| JP | 2001-281704 | * | 10/2001 |
| JP | 2001-318624 | | 11/2001 |
| JP | 2002-175028 | | 6/2002 |
| JP | 2002-305210 | | 10/2002 |
| JP | 2003-330388 | | 11/2003 |
| JP | 2004-348144 | | 12/2004 |

OTHER PUBLICATIONS

Office Action issued in corresponding Japanese Patent Application No. 2005-364021; issued Mar. 31, 2009.

Office Action issued in corresponding Japanese Patent Application No. 2005-364021; issued Mar. 16, 2010.

* cited by examiner

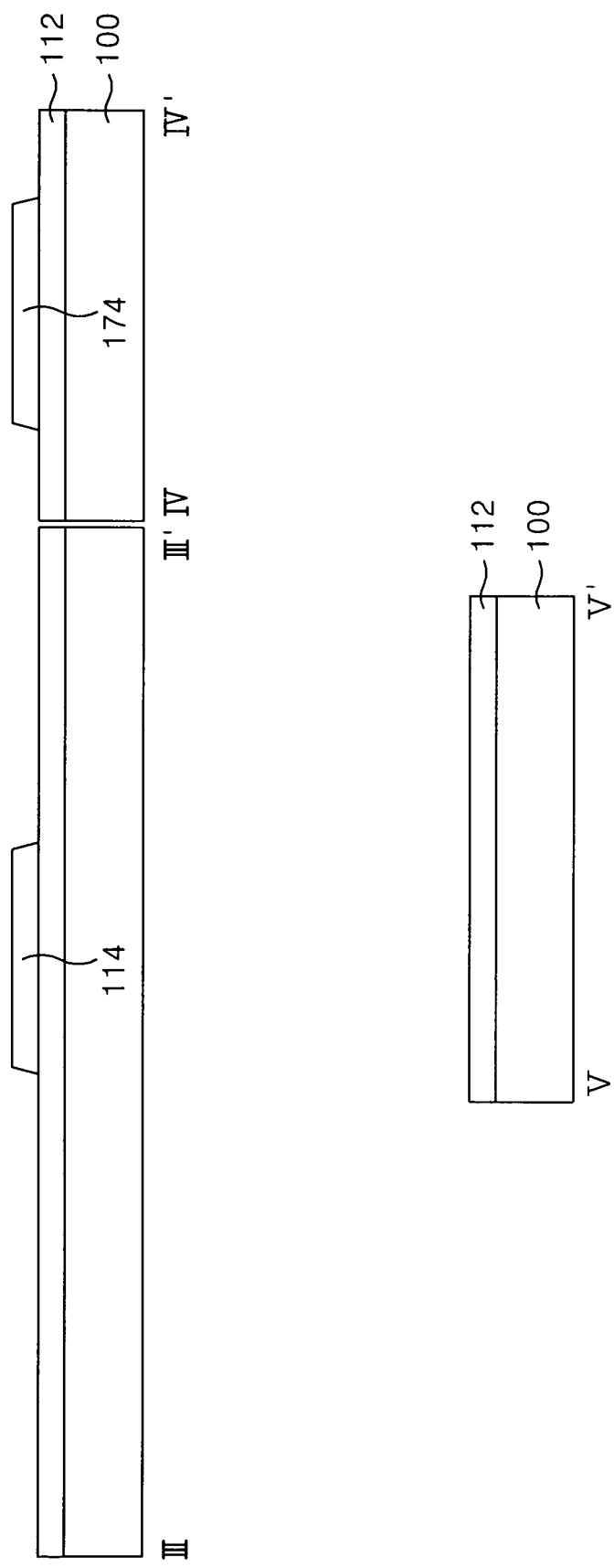

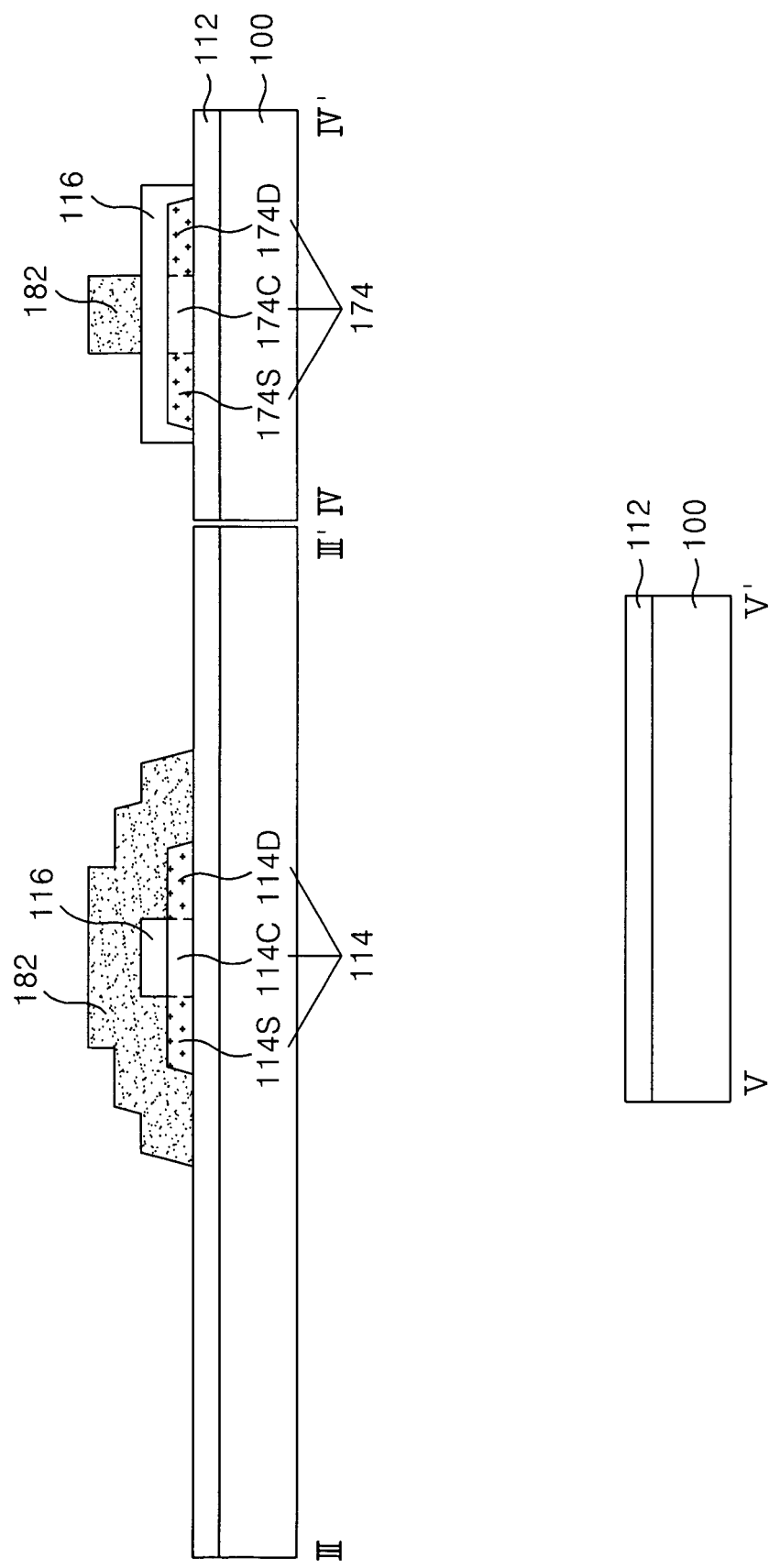

THIN FILM TRANSISTOR LIQUID CRYSTAL DISPLAY PANEL HAVING GATE LINE AND DATA LINE FORMED ON SAME LAYER AND METHOD OF FABRICATING THE SAME

This application claims the benefit of the Korean Patent Application No. P2005-58635 filed on Jun. 30, 2005, which is hereby incorporated by reference.

TECHNICAL FIELD

The present embodiments are directed to a liquid crystal display panel using a poly silicon thin film transistor, and more particularly to a poly silicon thin film transistor liquid crystal display panel that is adaptive for simplifying a process, and a fabricating method thereof.

BACKGROUND

Generally, a liquid crystal display LCD device has liquid crystal cells, which are arranged in a liquid crystal display panel in a matrix shape. The liquid crystal cells control light transmittance in accordance with a video signal, thereby displaying a picture.

A thin film transistor (hereinafter, referred to as 'TFT') is used as a switching device for independently supplying a video signal in each of the liquid crystal cells. Amorphous silicon or poly silicon is used for a semiconductor layer of such a TFT. When using poly silicon, which has a charge mobility 100 times faster than amorphous silicon, a drive circuit with a high response speed can be embedded in the liquid crystal display panel.

FIG. 1 briefly illustrates a TFT substrate of a related art poly liquid crystal display panel where a drive circuit is embedded.

A poly silicon TFT substrate shown in FIG. 1 includes a picture display area 7 where a TFT 30 and a pixel electrode 22 are formed at each pixel area defined by the crossing of a gate line 2 and the data line 4; a data driver 5 for driving the data line 4 of the picture display area 7; and a gate driver 3 for driving the gate line 2 of the picture display area 7.

The picture display area 7 includes the TFT 30 and the pixel electrode 22 which are formed at each pixel area that is defined by the cross of a plurality of gate lines 2 and a plurality of data lines 4. The TFT 30 charges a video signal from the data line 4 in the pixel electrode 22 in response to a scan signal of the gate line 2. The pixel electrode 22 charged with the video signal generates a potential difference with a common electrode of a color filter substrate which faces a TFT substrate with liquid crystal therebetween, thereby making liquid crystal molecules rotate by dielectric anisotropy in accordance with the potential difference. The light transmittance is changed in accordance with the degree of rotation of the liquid crystal molecules, thereby realizing a gray level.

The gate driver 3 sequentially drives the gate line 2.

The data driver 5 supplies a video signal to the data line 4 whenever the gate line 2 is driven.

FIG. 2 is a plane view illustrating an enlarged pixel area included in a picture display area 7 of the poly silicon TFT substrate shown in FIG. 1, and FIG. 3 is a sectional diagram illustrating a pixel area of the TFT substrate shown in FIG. 2, taken along the line I-I'.

The TFT substrate shown in FIGS. 2 and 3 includes a TFT 30 connected to the gate line 2 and the data line 4, and a pixel electrode 22 connected to the TFT 30. The TFT 30 is an NMOS TFT or a PMOS TFT, but only the NMOS TFT is explained below.

The TFT 30 includes a gate electrode 6 connected to the gate line 2; a source electrode included in the data line 4; and a drain electrode 10 connected to the pixel electrode 22 through a pixel contact hole 20 that penetrates a passivation film. The gate electrode 6 is formed to overlap a channel area 14C of a semiconductor layer 14 which is formed on a buffer film 12 with a gate insulating film 16 therebetween. The source electrode and the drain electrode 10 are formed on an interlayer insulating film 26. The interlayer insulating film 26 is also between the gate electrode 6 and the source and drain electrodes. The source electrode and the drain electrode 10 are respectively connected to a source area 14S and a drain area 14D of the semiconductor layer 14 into which n+ impurities are injected through a source contact hole 24S and a drain contact hole 24D which penetrates the interlayer insulating film 26 and the gate insulating film 16.

The picture display area 7 of the poly silicon TFT substrate is formed by six mask processes as below.

Specifically, in a first mask process, a buffer film 12 is formed on a lower substrate 1 and the semiconductor layer 14 is formed thereon. The semiconductor layer 14 is formed by patterning a poly silicon layer with a photolithography process and an etching process using a first mask after depositing amorphous silicon on the buffer film 12 and crystallizing the deposited amorphous silicon with a laser to form the poly silicon.

In a second mask process, the gate insulating film 16 is formed on the buffer film 12 where the semiconductor layer 14 is formed, and the gate line 2 and the gate electrode 6 are formed thereon. The gate electrode 6 is used as a mask to inject n+ impurities into a non-overlapping area of the semiconductor layer 14, thereby forming the source area 14S and the drain area 14D of the semiconductor layer 14.

In a third mask process, the interlayer insulating film 26 is formed on the gate insulating film 16 where the gate line 2 and the gate electrode 6 are formed, and the source contact hole 24S and the drain contact hole 24D are formed to penetrate the interlayer insulating film 26 and the gate insulating film 16.

In a fourth mask process, the drain electrode 10 and the data line 4 including the source electrode are formed on the interlayer insulating film 26.

In a fifth mask process, the passivation film 18 is formed on the interlayer insulating film 26 where the data line 4 and the drain electrode 10 are formed, and a pixel contact hole 20 is formed to penetrate the passivation film 18 to expose the drain electrode 10.

In a sixth mask process, a transparent pixel electrode 22 connected to the drain electrode 10 through the pixel contact hole 20 is formed on the passivation film 18.

In this way, the picture display area 7 of the related art poly silicon TFT substrate is formed by the six mask processes. However, the fabricating process is complicated because each mask process includes a number of processes, for example: a thin film deposition process, a cleaning process, a photolithography process, an etching process, a photo resist peeling process, an inspection process and so on.

Further, the related art poly silicon TFT substrate is used to form a CMOS TFT if a storage capacitor is formed in the picture display area 7 and the gate driver 3 and data driver 5 are formed. This increases the number of processes to nine mask processes, which further complicates the fabricating process. Accordingly, a method that reduces the number of mask processes of the poly silicon TFT substrate is desirable, at least for reasons of cost among others.

BRIEF SUMMARY

By way of introduction only, a TFT LCD panel according to an aspect of the present invention comprises a first signal line; a second signal line separated by the first signal line; a first thin film transistor having a first semiconductor layer doped with a first impurity, a first gate electrode overlapping the first semiconductor layer with a first insulating pattern therebetween, a first source electrode and a first drain electrode separated from the first gate electrode and connected with the first semiconductor layer; a passivation film protecting the first thin film transistor; a first contact hole exposing the first drain electrode by penetrating the passivation film; a pixel electrode connected with the first drain electrode through the first contact hole; a plurality of second contact holes penetrating the passivation film such that ends of a separated part of the second signal line are exposed; and a first contact electrode connecting the separated parts of the second signal line through the second contact holes.

A TFT LCD panel according to another aspect of the present invention comprises gate, data, and storage lines disposed on the same layer in a display area of the liquid crystal display panel, at least one of the gate, data, or storage lines being discontinuous in the pixel region and at least one of the gate, data, or storage lines being continuous in the pixel region, the continuous line bisecting segments of the discontinuous line in the display area; a thin film transistor having a semiconductor layer, a gate electrode overlapping the semiconductor layer with an insulating pattern therebetween, and source and drain electrodes separated from the gate electrode and connected with the semiconductor layer; a passivation layer on the thin film transistor and the gate, data, and storage lines; and a contact electrode connecting the segments of the discontinuous line through second contact holes in the passivation layer.

A method of fabricating a TFT LCD panel according to an aspect of the present invention comprises forming a first semiconductor layer on a substrate; doping the first semiconductor layer with a first impurity to form a source area and a drain area of the first semiconductor layer; forming a first insulating pattern overlapping a channel area between the source and drain areas; forming a first conductive pattern group on the substrate, wherein the first conductive pattern group has a gate line, a first gate electrode connected with the gate line and overlapping the first insulating pattern, a first source electrode and a first drain electrode connected with the source and drain areas of the first semiconductor layer, respectively, and a data line connected with the first source electrode, at least one of the gate or data lines being discontinuous; forming a passivation film on the substrate where the first conductive pattern group is formed, a first contact hole that exposes the first drain electrode, and a second contact hole that exposes a part of the discontinuous line; and forming a pixel electrode connected with the first drain electrode through the first contact hole, and a first contact electrode that connects the discontinuous line through the second contact hole.

BRIEF DESCRIPTION OF THE DRAWINGS

The following detailed description of the embodiments of the present invention reference the accompanying drawings, in which:

FIGS. 6A to 6F are sectional diagrams of a fabricating method of a poly silicon TFT substrate according to an embodiment.

DETAILED DESCRIPTION

Reference will now be made in detail to embodiments of the present invention, examples of which are illustrated in the accompanying drawings.

With reference to FIGS. 4 to 6F, embodiments of the present invention will be explained as follows.

Figure 1:
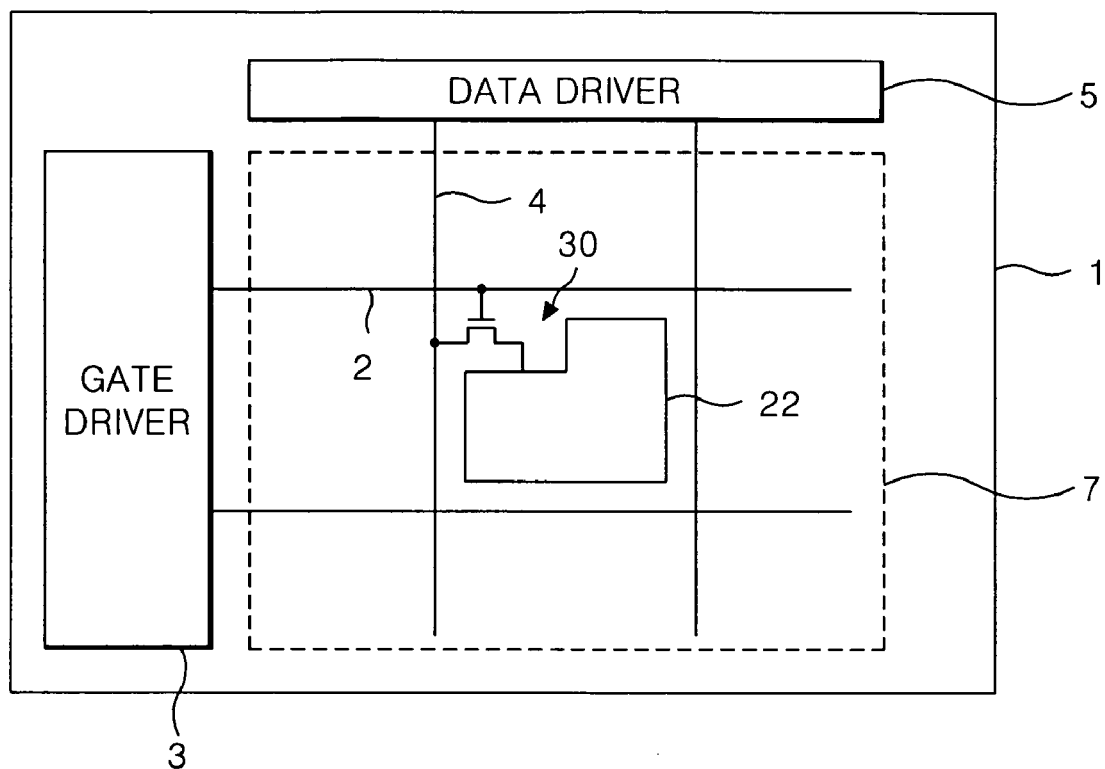
FIG. 1 is a block diagram briefly illustrating a related art poly silicon TFT substrate.
Figure 2:
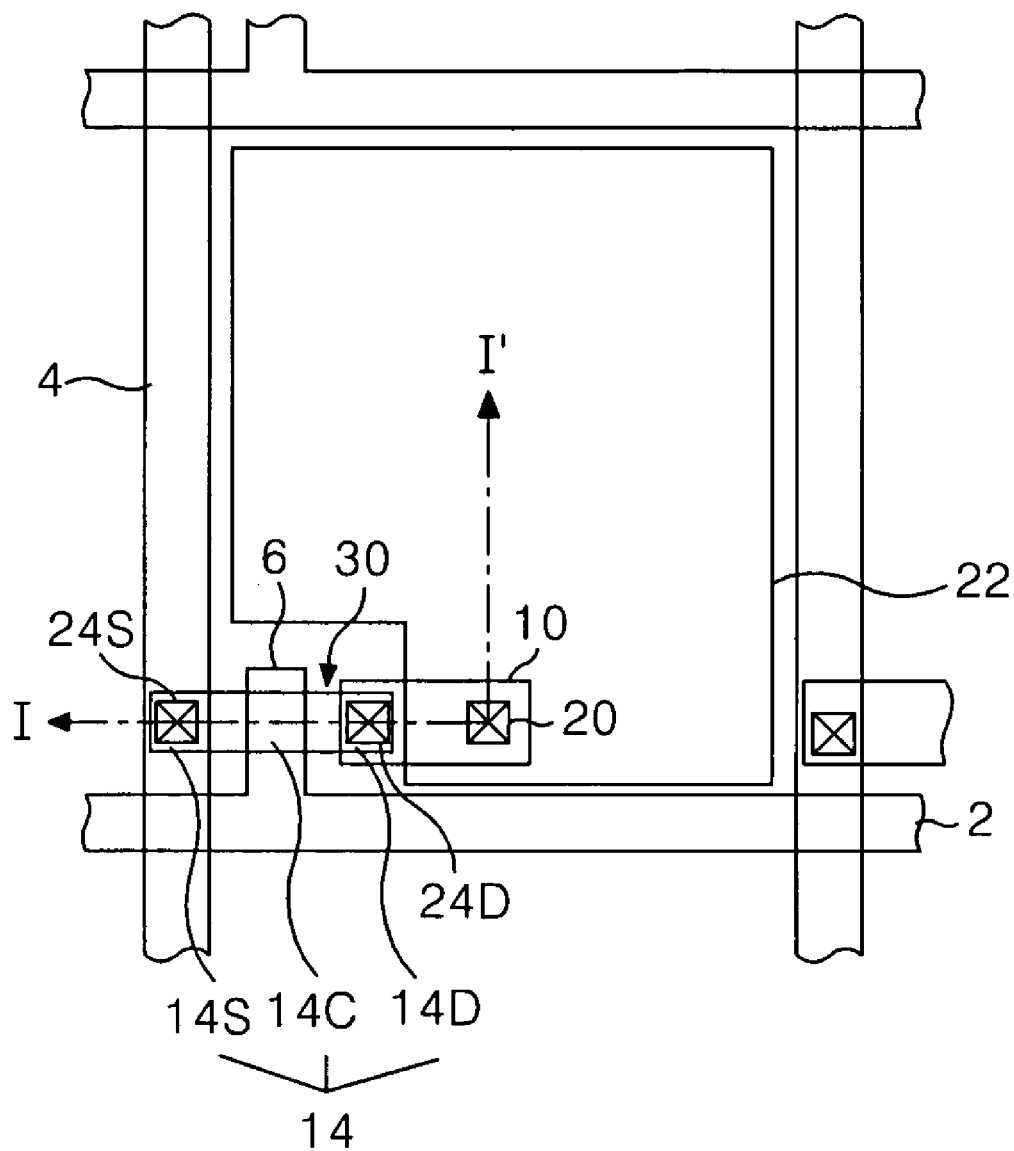
FIG. 2 is a plane view illustrating an enlarged pixel area of FIG. 1.
Figure 3:
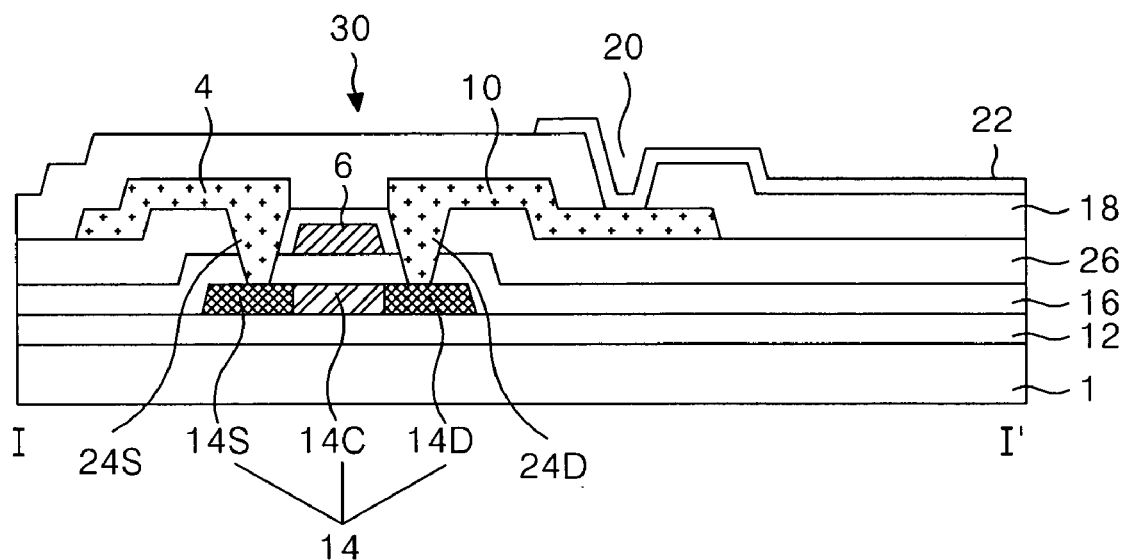
FIG. 3 is a sectional diagram illustrating a pixel area shown in FIG. 2, taken along the line I-I'.
Figure 4:
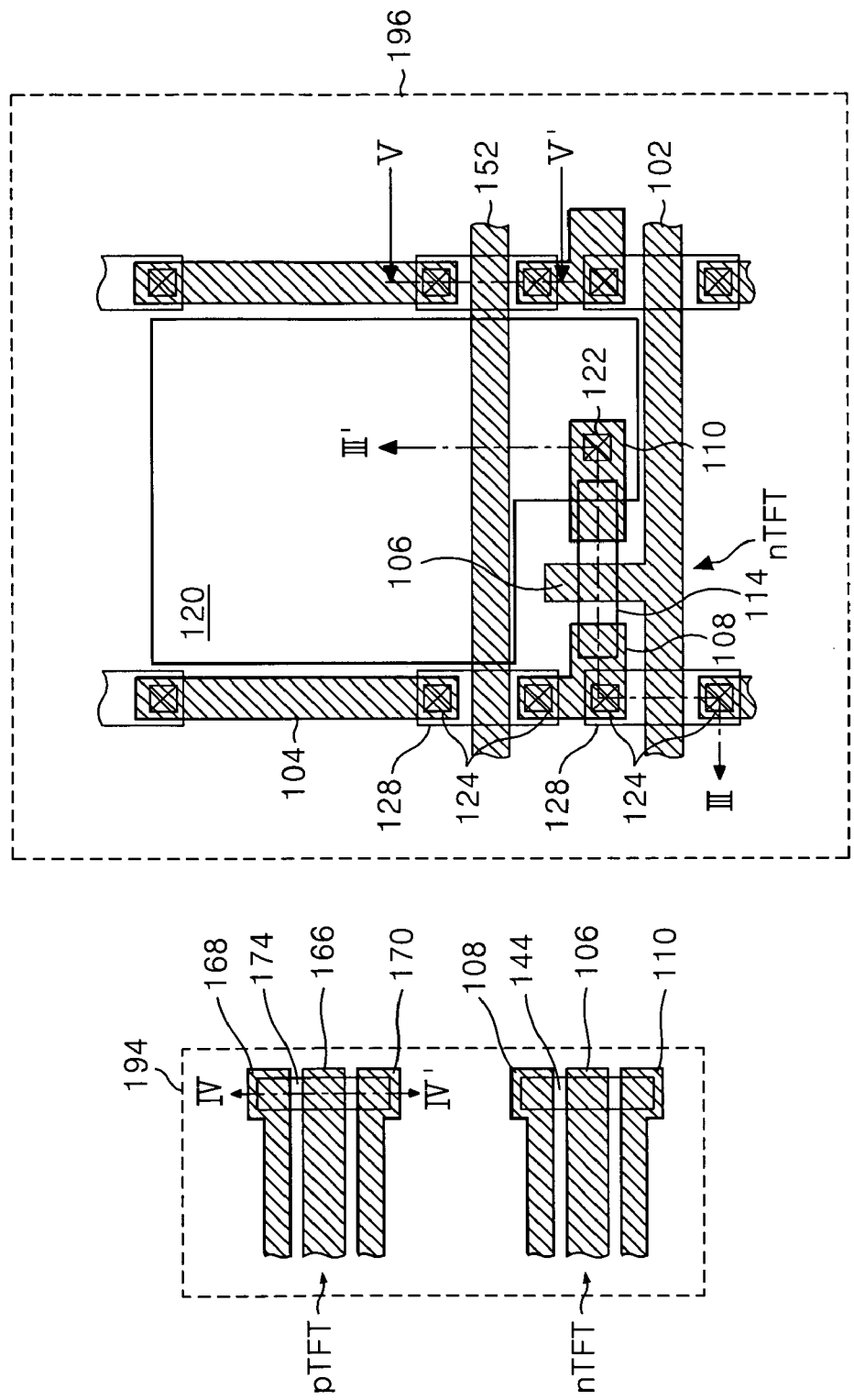
FIG. 4 is a plane view partially illustrating a poly silicon TFT substrate according to an embodiment of the present invention.
Figure 5:
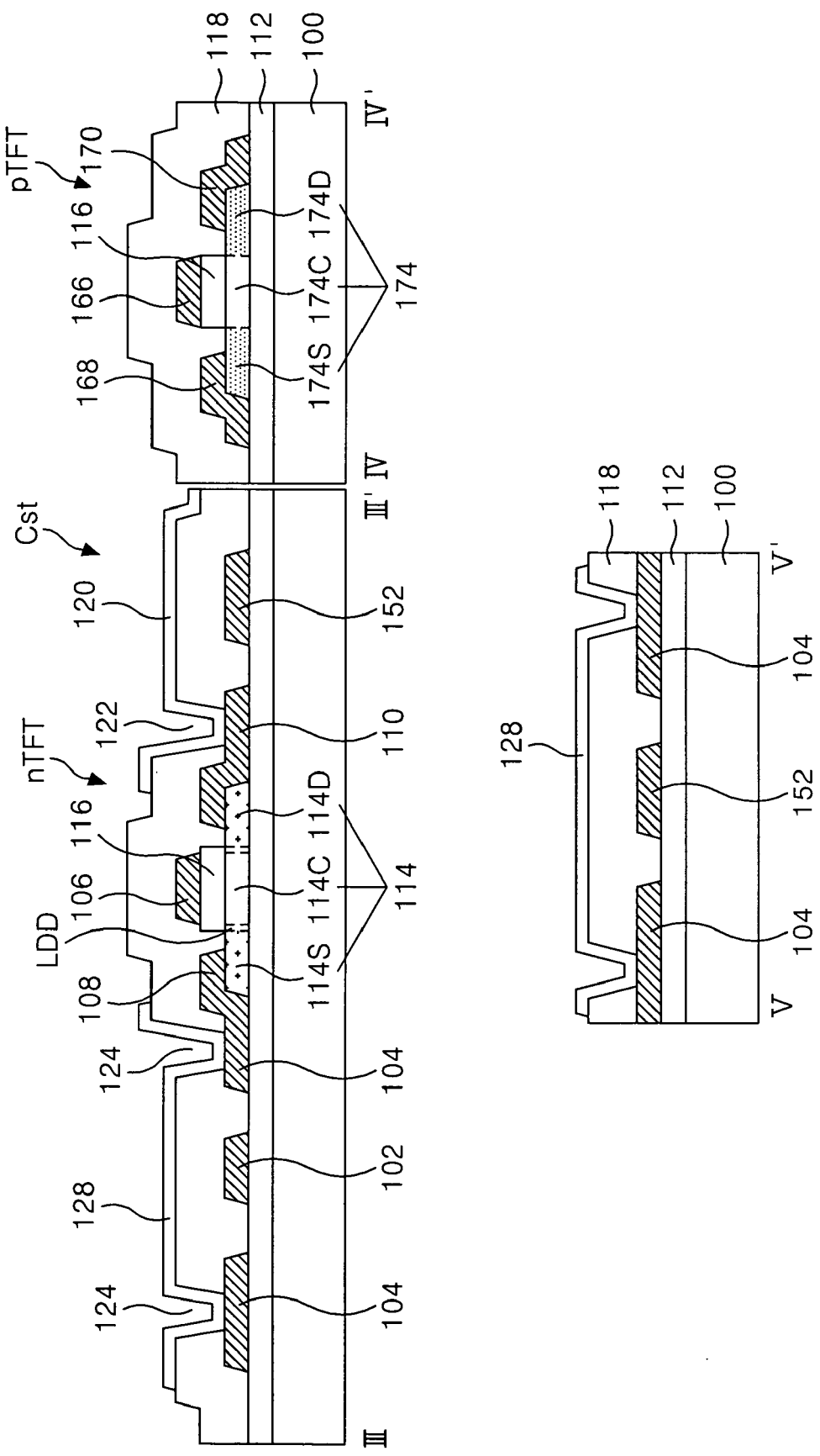
FIG. 5 is a sectional diagram illustrating the poly silicon TFT substrate shown in FIG. 4, taken along the lines III-III' and IV-IV'.

FIG. 4 is a plane view illustrating part of a poly silicon TFT substrate according to an embodiment of the present invention, and FIG. 5 is a sectional diagram illustrating the TFT substrate shown in FIG. 4, taken along the lines III-III' and IV-IV'.

A polysilicon TFT substrate shown in FIGS. 4 and 5 includes a picture display area 196 and a driver area 194 where a drive circuit is formed to drive a gate line 102 and a data line 104 of the picture display area 196.

The picture display area 196 includes an nTFT (n-channel TFT) connected to the gate line 102 and the data line 104, a pixel electrode 120 connected to the nTFT and a storage capacitor Cst. The driver area 194 includes a pTFT (p-channel TFT) and the nTFT which are connected in a CMOS structure.

The nTFT supplies a video signal of the data line 104 to the pixel electrode 120 in response to a gate signal of the gate line 102. For this, the nTFT includes a first gate electrode 106 connected to the gate line 102; a first source electrode 108 connected to the data line 104; a first drain electrode 110 connected to the pixel electrode 120; and a first semiconductor layer 114 which forms a channel between the first source electrode 108 and the first drain electrode 110. The first source electrode 108 and the first drain electrode 110 are respectively connected to a source area 114S and a drain area 114D of the first semiconductor layer 114. And, the nTFT further includes a channel area 114C for reducing an off-current and an LDD (lightly doped drain) area where n–impurities are injected between the source area 114S and the drain area 114D.

The pTFT includes a second semiconductor layer 174 formed on a buffer film 112; a second gate electrode 166 which overlaps a channel area 174C of a second semiconductor layer 174 with a gate insulating film 116 therebetween; and a second source electrode 168 and a second drain electrode 170 which are respectively connected to a source area 174S and a drain area 174D of the second semiconductor layer 174. Herein, the source area 174S and the drain area 174D of the second semiconductor layer 174 are formed by having p impurities injected.

The pixel electrode 120 is connected to the first drain electrode 110 of the pixel display area 196 through a first contact hole 122 that penetrates a passivation film 118. The pixel electrode 120 is charged with the video signal supplied from the nTFT and generates a potential difference with a common electrode which is formed in a color filter substrate (not shown). The potential difference causes a liquid crystal located in the color filter substrate and the TFT substrate to rotate by dielectric anisotropy. This causes the transmittance of the light that is incident through the pixel electrode 120 from a light source (not shown) to be controlled to transmit the light to the color filter substrate.

The storage capacitor Cst is formed by having the storage line 152 overlap the pixel electrode 120 with the passivation film 118 therebetween. The storage capacitor Cst stabilizes the video signal charged in the pixel electrode 120.

The data line 104 is formed along with the gate line 102 and the storage line 152. Hereby, the data line 104 is formed so as not to be short-circuited with the gate line 102 and the storage line 152. For example, the data line 104, as shown in FIG. 4, is separated from the gate line 102 and the storage line 152 so as not to be short-circuited. The separated data line 104 is connected through a contact electrode 128 which is formed on the passivation film 118.

Specifically, the contact electrode 128 is formed to be insulated from and to cross the gate line 102 or the storage line 152, and is connected to both ends of separated the data line 104 through the contact hole 124 exposing both ends of the separated data line 104. Accordingly, the data line 104 is discontinuous, that is, the data line 104 separated by the gate line 102 and/or the storage line 152. The portions of the data line 104 are connected through the contact electrode 128.

In other embodiments, the data line 104 may be continuous and the gate line 102 and/or the storage line 152 discontinuous, that is, separated by the data line 104. In this case, the separated gate line 102 or the storage line 152 is connected through the contact hole 124 penetrating the passivation film 118 as above and the contact electrode 128 crossing the data line 104.

A fabricating method of a poly silicon TFT substrate of the present invention with such a configuration is specifically explained as follows.

FIGS. 6A to 6F sectional diagrams of a fabricating method of a poly silicon TFT substrate according to an embodiment of the present invention.

Referring to FIG. 6A, the buffer film 112 is formed on the lower substrate 100, and the first and second semiconductors 114, 174 which are integrated by a first mask process are formed thereon.

Specifically, the buffer film 112 is formed by depositing an inorganic insulating material such as $SiO_2$ on the entire surface of the lower substrate 100. The first and second semiconductors 114, 174 are formed by forming an amorphous silicon thin film on the buffer film 112, crystallizing the amorphous silicon thin film into a poly silicon thin film, and then patterning the poly silicon thin film by a photolithography process and an etching process using a first mask. A dehydrogenation process may then be performed for eliminating hydrogen atoms which exist within the amorphous silicon thin film before crystallizing the amorphous silicon thin film. One method of crystallizing the amorphous silicon thin film is a sequential lateral crystallization SLS method. In the SLS method, a laser beam is scanned in a horizontal direction, which causes the crystal grain to grow in the horizontal direction, thereby increasing the size of grain. The laser beam may be an excimer laser. This is only one of the methods of annealing using a laser.

Figure 6B:
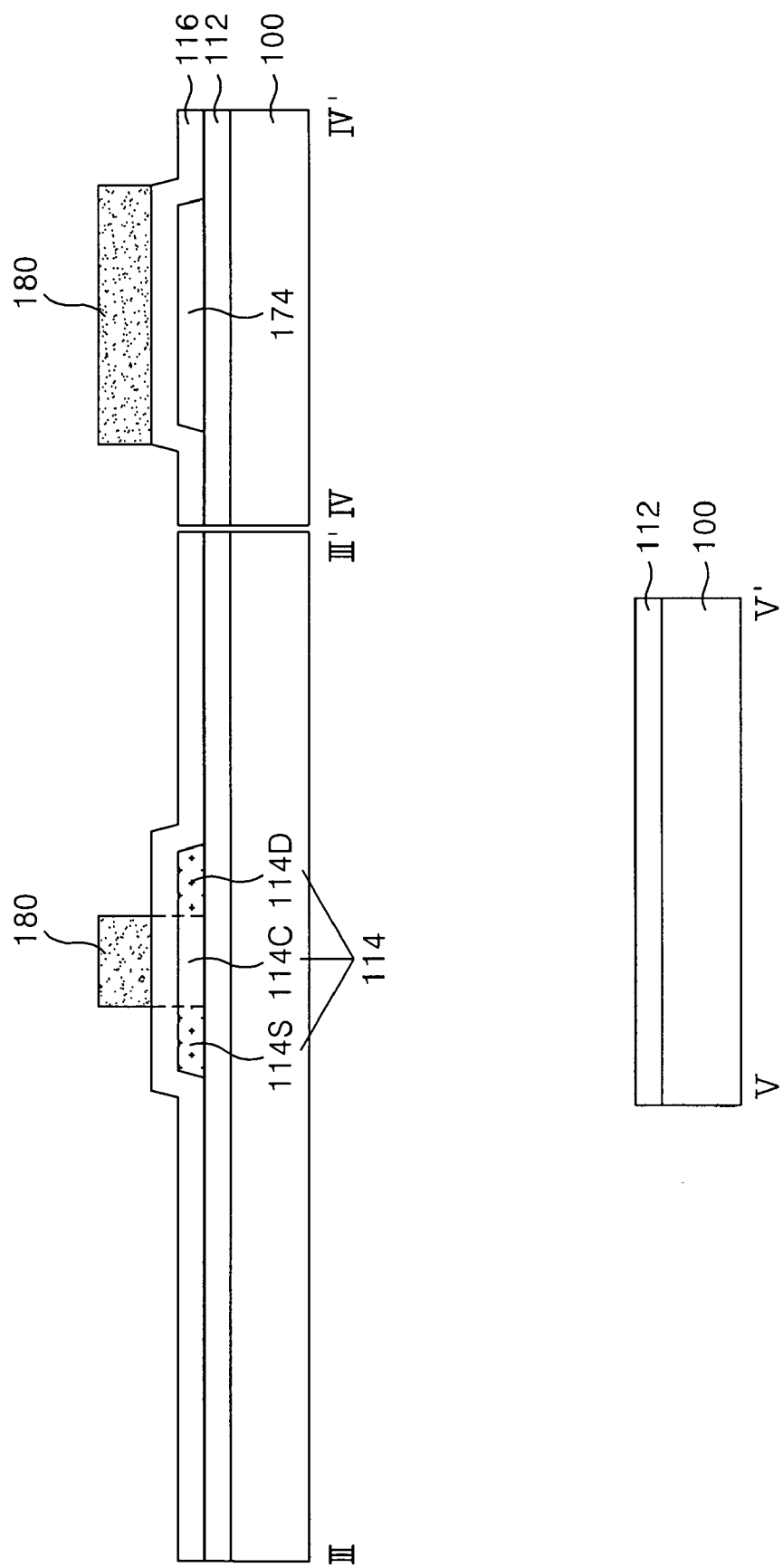

Referring to FIG. 6B, the gate insulating film 116 is formed on the buffer film 112 where the first and second semiconductor films 114, 174 are formed. The source and drain areas 114S, 114D of the first semiconductor layer 114 are doped with n+ impurities. The gate insulating film 116 is then patterned by a second mask process.

Specifically, in one embodiment, the gate insulating film 116 is formed by depositing an inorganic insulating material such as $SiO_2$ on the entire surface of the buffer film 112 where the first and second semiconductor films 114, 174 are formed.

For n+ doping, a first photo resist pattern 180 that covers or intercepts the second semiconductor layer 174 and the channel area 114C of the first semiconductor layer 114 is formed by the photolithography process using the second mask. Subsequently, n+ doping is performed only in the drain area 114D and the source area 114S of the first semiconductor layer 114 having the first photo resist pattern 180 as a mask.

The gate insulating film 116 is then patterned by the etching process using the first photo resist pattern 180 as a mask. Accordingly, the gate insulating film 116 remains only at an overlapping part of the second semiconductor layer 174 and the channel area 114C of the first semiconductor layer 114 as shown in FIG. 6C. The first photo resist pattern 180 is then removed by a stripping process.

Referring to FIG. 6C, by a third mask process, p+ doping is performed in the source area 174S and the drain area 174D of the second semiconductor layer 174. The gate insulating film 116 is subsequently etched.

Specifically, in one embodiment, for p+ doping, a second photo resist pattern 182 that covers or intercepts the channel area 174C of the second semiconductor layer 174 and the first semiconductor layer 114 is formed by the photolithography process using the third mask. Subsequently, p+ doping is performed only in the drain area 174D and the source area 174S of the second semiconductor layer 174 having the second photo resist pattern 182 as a mask.

The gate insulating film 116 which overlaps the source and drain areas 174S, 174D of the second semiconductor is then removed by the etching process using the second photo resist pattern 182 as a mask. As a result, the gate insulating film 116 remains only in the channel areas 114C, 174C of the first and second semiconductor layers 114, 174 as shown in FIG. 6D.

Figure 6D:
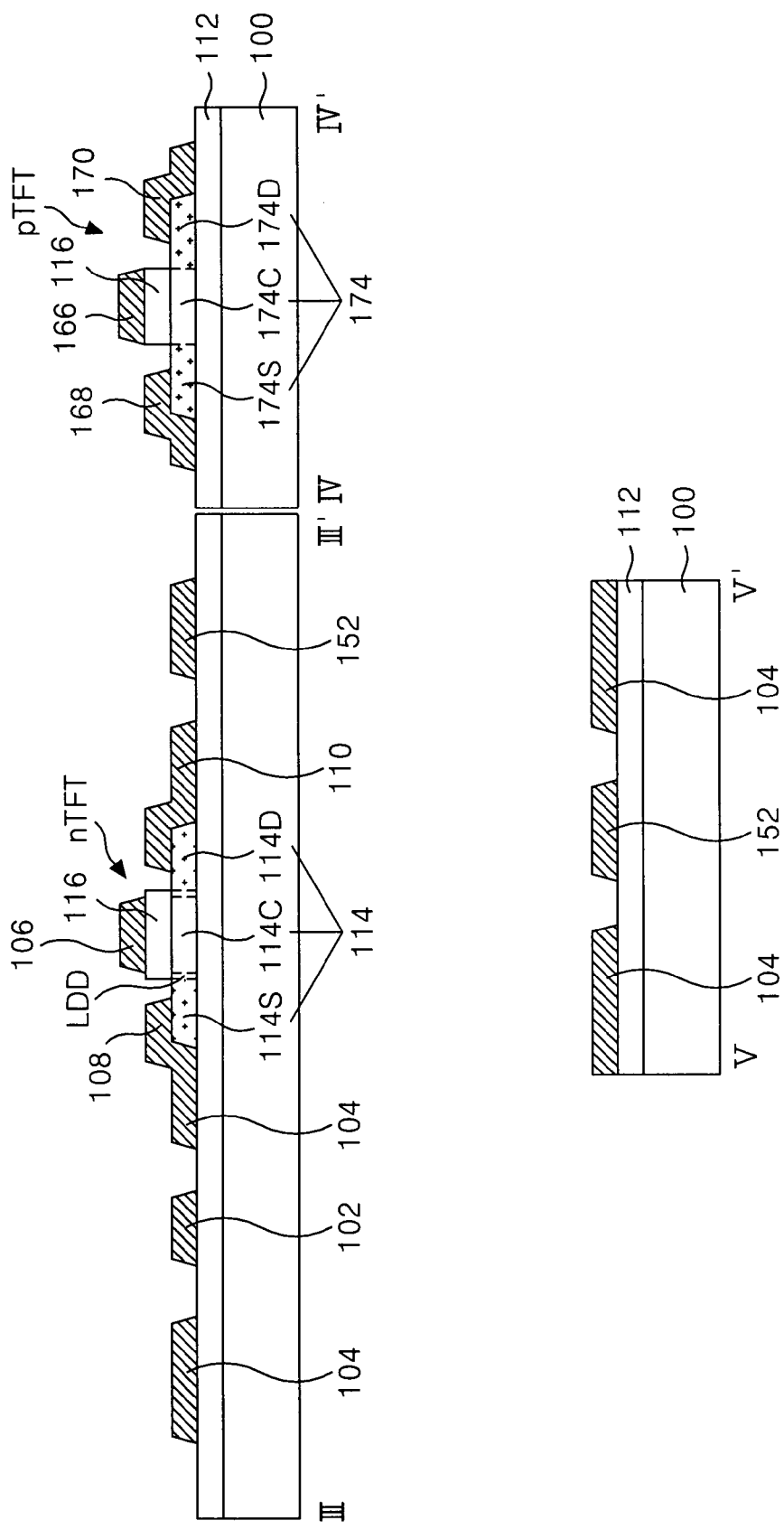

Referring to FIG. 6D, a first conductive pattern group is formed by a fourth mask process. The first conductive pattern group includes the gate line 102, the gate electrode 106, 166, the data line 104, the storage line 152, the source electrode 108, 168 and the drain electrode 110, 170.

Specifically, a first conductive layer is formed on a buffer film 112 where the gate insulating film 116 remains, and then the first conductive layer is patterned by the photolithography process and the etching process using the fourth mask, thereby forming the first conductive pattern group. The first conductive layer includes a metal layer that a metal material such as Mo, Ti, Cu, AlNd, Al, Cr, Mo alloy, Cu alloy, Al alloy and so on is deposited in a single layer or in a multiple layer. The source electrode 108, 168 and the drain electrode 110, 170 are separated so as not to be short-circuited, and the data line 104 is separated by the gate line 102 and/or the storage line 152. In other embodiments, the gate line 102 and/or the storage line 152 may be formed to be separated by the data line 104.

Subsequently, n− doping is performed through both sides of a gate insulating film 116 which is exposed at side of the gate electrode 106, thereby forming the LDD area. The LDD area does not overlap the first gate electrode 106 in the channel area 114C of the first semiconductor layer 114.

Figure 6E:
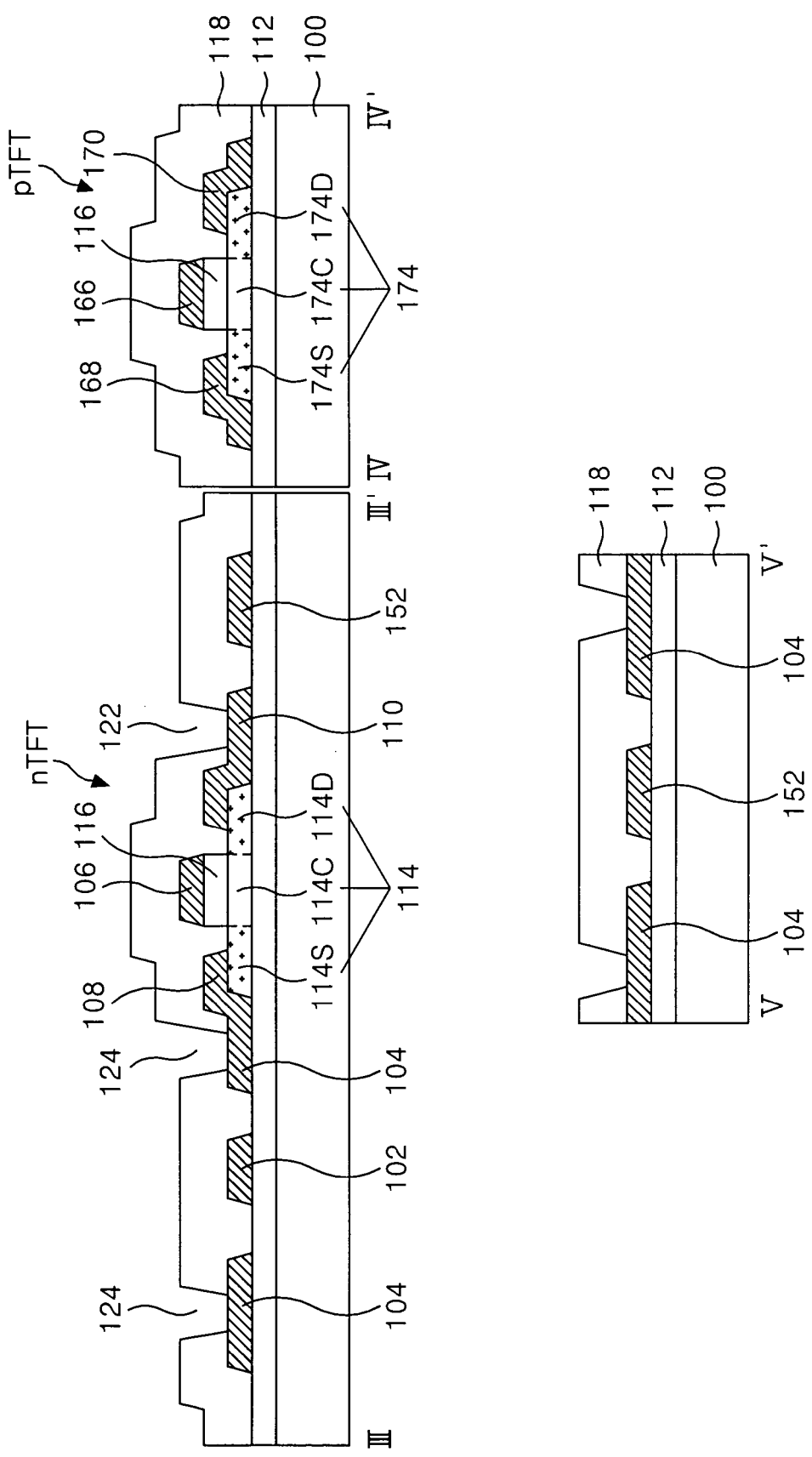

Referring to FIG. 6E, the passivation film 118 is formed on the buffer film 112 where the first conductive pattern group is formed. The first and second contact holes 122, 124, which penetrate the passivation film 118, are formed by a fifth mask process.

Specifically, the passivation film 118 is formed by depositing an organic insulating material or an inorganic insulating material such as $SiO_2$ and SiNx on the entire surface of the buffer film 112 where the first conductive pattern group is formed. Subsequently, the passivation film 118 is patterned by the photolithography process and the etching process using the fifth mask, thereby forming a plurality of contact holes 122, 124.

Figure 6F:
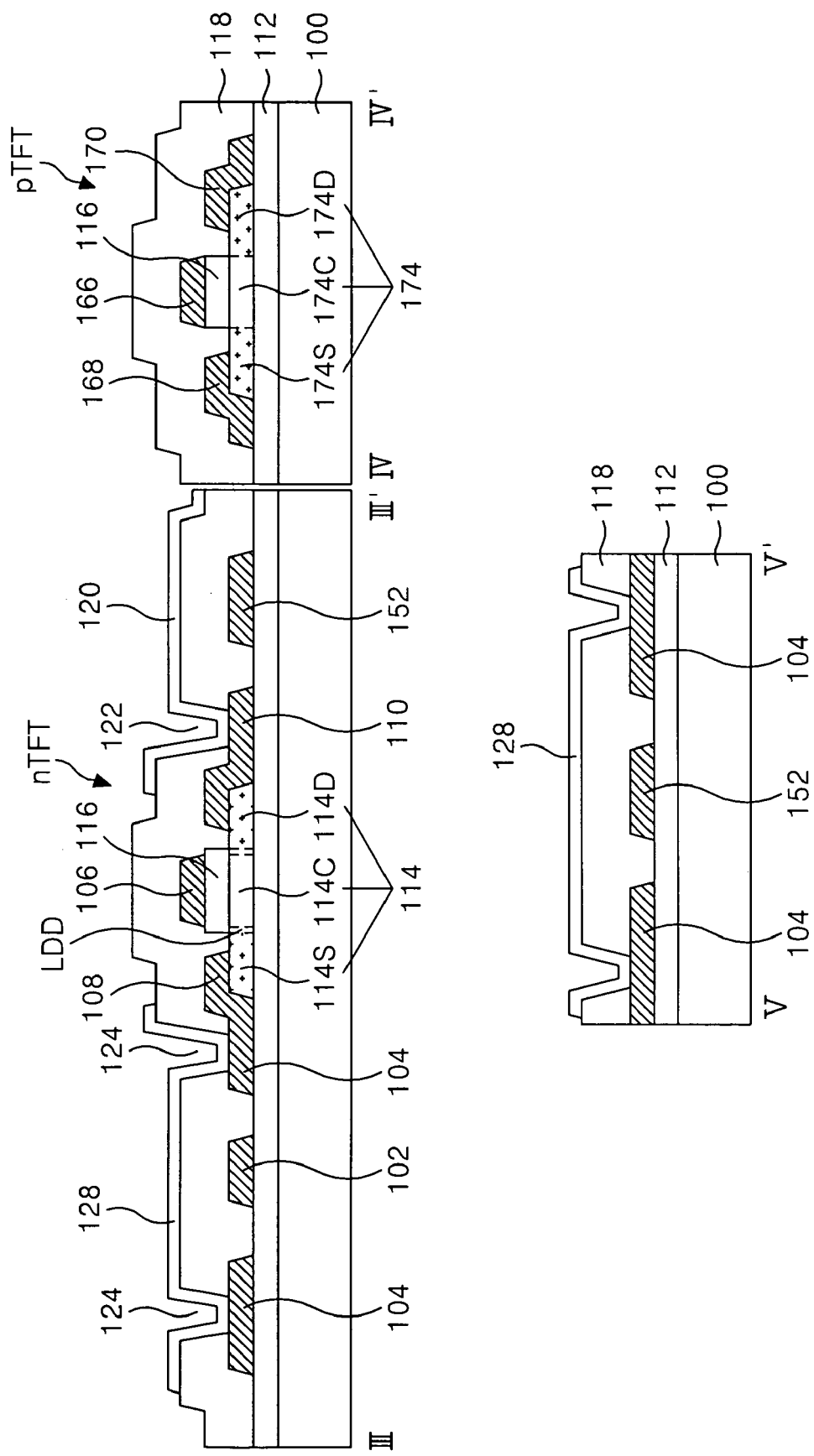

Referring to FIG. 6F, a second conductive pattern group is formed by a sixth mask process. The second conductive pattern group includes the pixel electrode 120 and the contact electrode 128 on the passivation film.

Specifically, a transparent conductive layer is formed on the passivation film 118, and then is patterned by the photolithography process and the etching process using the sixth mask, thereby forming the second conductive pattern group. The transparent conductive layer may comprise ITO (indium tin oxide), TO (tin oxide), IZO (indium zinc oxide), and/or ITZO, for example. The pixel electrode 120 is connected to the first drain electrode 110 through a first contact hole 122, and the contact electrode 124 is connected to the separated data line 104 through a second contact hole 124 to connect the separated data line 104. In other embodiments, if the gate line 102 or the storage line 152 is separated, the contact electrode 124 is connected to the separated gate line 102 or storage line 152 through the second contact hole 124 to connect the separated gate line 102 or to connect the separated storage line 152, respectively.

In this way, the poly silicon TFT substrate fabrication method forms the gate line 102, the data line 104, the storage line 152, the gate electrode 106, 166, the source electrode 108, 168 and the drain electrode 110, 170 by the same mask process, thus it is possible to reduce the number of mask processes. Further, the poly silicon TFT substrate fabrication method forms the storage capacitor Cst by overlapping of the pixel electrode 120 and the storage line 152. It is thus possible to reduce the number of the mask processes more than when the storage capacitor is formed by overlapping of the storage line and the semiconductor layer.

As described above, the poly silicon TFT substrate and the fabricating method thereof forms the data line and the source and drain electrodes along with the gate line and the storage line by the same mask process. The separated data line, gate line and/or storage line is connected to the contact electrode which is formed along with the pixel electrode. Further, the poly silicon TFT substrate and the fabricating method thereof forms the storage capacitor by overlapping of the pixel electrode and the storage line.

As a result, the poly silicon TFT substrate and the fabricating method thereof can reduce the number of processes to six mask processes. Accordingly, the material cost and equipment investment cost can be reduced and the yield can be improved.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A thin film transistor liquid crystal display panel, comprising:
a buffer layer formed on a substrate;
a gate line formed on the buffer layer;
a data line separated by the gate line;
a first thin film transistor having a first semiconductor layer, a first gate electrode overlapping a channel area of the first semiconductor layer with a first insulating pattern therebetween, a first source electrode separated from the first gate electrode and directly connected with a source area of the first semiconductor layer, and a first drain electrode separated from the first gate electrode and directly connected with a drain area of the first semiconductor layer, wherein the source and drain areas are doped with the first impurity;
a second thin film transistor having a second semiconductor layer doped with a second impurity, a second gate electrode overlapping the second semiconductor layer with a second insulating pattern therebetween, and a second source electrode and a second drain electrode separated from the second gate electrode and connected with the second semiconductor layer;
a passivation film protecting the first and second thin film transistors;
a first contact hole penetrating the passivation film and exposing the first drain electrode;
a pixel electrode connected with the first drain electrode through the first contact hole;
a storage line overlapping the pixel electrode with the passivation film therebetween to form a storage capacitor, wherein the storage line is parallel to the gate line and the data line is separated by the storage line;
a plurality of second contact holes penetrating the passivation film such that parts of the data line separated by the gate line are exposed;
a first contact electrode connecting the parts of the data line separated by the gate line through the second contact holes,
wherein the gate line, the storage line, the first source electrode and the first drain electrode are formed of the same material on the buffer layer and are coplanar to each other;
wherein the pixel electrode and the first contact electrode comprise a transparent conductive layer on the passivation film;
wherein the first insulating pattern is formed only between the first gate electrode and the channel area of the first semiconductor layer; and
wherein the second insulating pattern is formed only between the second gate electrode and a channel area of the second semiconductor layer and has same width as the second gate electrode.

2. The thin film transistor liquid crystal display panel according to claim 1, wherein the first signal line comprises a data line connected with the first source electrode, and the second signal line comprises a gate line separated by the data line and connected with the first gate electrode.

3. The thin film transistor liquid crystal display panel according to claim 1, further comprising:
a first drive circuit to drive the gate line; and
a second drive circuit to drive the data line,
wherein at least one of the first or second drive circuits comprises the first thin film transistor and the second thin film transistor that has a different semiconductor layer from the first thin film transistor.

4. The thin film transistor liquid crystal display panel according to claim 1, wherein the gate line is connected with the first gate electrode, and the data line is separated by the gate line and connected with the first source electrode.

5. The thin film transistor liquid crystal display panel according to claim 4, wherein the storage line is parallel to the gate line and the storage line is separated by the data line.

6. The thin film transistor liquid crystal display panel according to claim 1, further comprising:
a plurality of third contact holes penetrating the passivation film such that sides of parts of the data line separated by the storage line are exposed; and a second contact electrode connecting the parts of the data line separated by the storage line through the third contact holes.

7. The thin film transistor liquid crystal display panel according to claim 6, wherein the pixel electrode and the first and second contact electrodes comprise a transparent conductive layer.

8. The thin film transistor liquid crystal display panel according to claim 5, further comprising:
   a plurality of third contact holes penetrating the passivation film such that sides of parts of the storage line separated by the data line are exposed; and
   a second contact electrode connecting the parts of the storage line separated by the data line through the third contact holes.

9. The thin film transistor liquid crystal display panel according to claim 8, wherein the pixel electrode and the first and second contact electrodes comprise a transparent conductive layer.

10. The thin film transistor liquid crystal display panel according to claim 1, wherein the gate line, the data line, the first gate electrode, the first source electrode, the first drain electrode and the storage line are formed of the same material.

11. The thin film transistor liquid crystal display panel according to claim 1, wherein the first semiconductor layer further comprises an LDD (lightly doped drain) region formed on sides of the channel area.

12. The thin film transistor liquid crystal display panel according to claim 1, wherein the second semiconductor layer comprises:
   the channel area overlapping the second gate electrode; and
   a source area and a drain area connected with the second source electrode and the second drain electrode, respectively, the source and drain areas doped with the second impurity.

* * * * *